(12) United States Patent
Kemmochi et al.

(10) Patent No.: US 8,361,228 B2
(45) Date of Patent: Jan. 29, 2013

(54) CRUCIBLE HAVING A DOPED UPPER WALL PORTION AND METHOD FOR MAKING THE SAME

(75) Inventors: Katsuhiko Kemmochi, Camas, WA (US); Yasuo Ohama, Fukui (JP)

(73) Assignees: Heraeus Shin-Etsu America, Inc., Camas, WA (US); Shin-Etsu Quartz Products Co., Ltd., Tokyo (JP)

( * ) Notice: Subject to any disclaimer, the term of this patent is extended or adjusted under 35 U.S.C. 154(b) by 477 days.

(21) Appl. No.: 12/752,998

(22) Filed: Apr. 1, 2010

(65) Prior Publication Data

US 2010/0186662 A1    Jul. 29, 2010

Related U.S. Application Data

(62) Division of application No. 11/612,327, filed on Dec. 18, 2006, now Pat. No. 7,716,948.

(51) Int. Cl.
*C30B 35/00* (2006.01)
(52) U.S. Cl. .............. 117/200; 117/213; 427/376.2
(58) Field of Classification Search ............ 117/200, 117/213; 427/376.2
See application file for complete search history.

(56) References Cited

U.S. PATENT DOCUMENTS

| | | | |
|---|---|---|---|
| 5,306,388 A * | 4/1994 | Nakajima et al. | 117/208 |
| 5,807,416 A | 9/1998 | Kemmochi et al. | |
| 5,877,027 A | 3/1999 | Kemmochi et al. | |
| 5,968,259 A | 10/1999 | Kemmochi et al. | |
| 5,976,247 A | 11/1999 | Hansen et al. | |
| 5,980,629 A | 11/1999 | Hansen et al. | |
| 6,510,707 B2 | 1/2003 | Kemmochi et al. | |
| 6,641,663 B2 | 11/2003 | Kemmochi et al. | |
| 7,383,696 B2 | 6/2008 | Kemmochi et al. | |
| 7,427,327 B2 | 9/2008 | Kemmochi et al. | |
| 7,556,764 B2 | 7/2009 | Kemmochi et al. | |
| 2003/0012898 A1* | 1/2003 | Kemmochi et al. | 428/34.4 |
| 2003/0106491 A1 | 6/2003 | Kemmochi et al. | |
| 2004/0040497 A1 | 3/2004 | Kemmochi et al. | |
| 2004/0072007 A1 | 4/2004 | Kemmochi et al. | |
| 2005/0120945 A1 | 6/2005 | Hansen | |
| 2006/0144327 A1* | 7/2006 | Ohama et al. | 117/200 |
| 2007/0051297 A1 | 3/2007 | Kemmochi et al. | |
| 2008/0141929 A1 | 6/2008 | Kemmochi et al. | |

FOREIGN PATENT DOCUMENTS

JP    2000-247778 A    9/2000
WO   WO 2006/019913 A1    2/2006

* cited by examiner

*Primary Examiner* — Matthew Song
(74) *Attorney, Agent, or Firm* — Marger Johnson & McCollom PC

(57) ABSTRACT

A fused glass crucible includes a collar of doped aluminum silica that defines uppermost and outermost surfaces of the crucible. The melt line that defines the surface of molten silicon in the crucible may be substantially at the lower end of the collar or slightly above it. Crystallization of the collar makes it hard and therefore supports the remaining uncrystallized portion of the crucible above the melt line. The melt line may also be below the lower end of the collar, especially if the melt is drawn down or poured early in the process. Because there is little or no overlap or because the overlap does not last long, the doped aluminum collar is not damaged by the heat of from the melt.

10 Claims, 4 Drawing Sheets

CRUCIBLE HAVING A DOPED UPPER WALL PORTION AND METHOD FOR MAKING THE SAME

CROSS-REFERENCE TO RELATED APPLICATION

This application is a Divisional of U.S. patent application Ser. No. 11/612,327, filed on Dec. 18, 2006, now U.S. Pat. No. 7,716,948, the contents of which are hereby incorporated herein by reference for all purposes.

SUMMARY OF THE INVENTION

1. Field of the Invention

The present invention relates to the field of silica crucibles and more particularly to a silica crucible having a doped layer formed in the wall.

2. Background of the Invention

The Czochralski (CZ) process is well-known in the art for production of ingots of single crystalline silicon, from which silicon wafers are made for use in the semiconductor industry.

In the CZ process, metallic silicon is charged in a silica glass crucible housed within a susceptor. The charge is then heated by a heater surrounding the susceptor to melt the charged silicon. A single silicon crystal is pulled from the silicon melt at or near the melting temperature of silicon.

In addition to the CZ process, fused silica crucibles are used to melt metallic silicon, which is then poured—from a nozzle formed into the crucible—into a mold to create a polycrystalline silicon ingot, which is used to make solar cells. As with the CZ crucible, a heater surrounds a susceptor, which holds the crucible.

When fused glass crucibles are so used, metallic silicon in the crucible melts—at least in part—as a result of radiant heat transmitted by the heater through the susceptor and crucible. The radiant heat melts the silicon in the crucible, which has a melting point of about 1410 degrees C., but not the crucible. Once the silicon in the crucible is melted, however, the inner surface of the crucible beneath the surface of the molten silicon is heated to the same temperature as the molten silicon by thermal conduction. This is hot enough to deform the crucible wall, which is pressed by the weight of the melt into the susceptor.

The melt line is the intersection of the surface of the molten silicon and the crucible wall. Because the wall above the melt line is not pressed into the susceptor by the weight of the melt, i.e., it is standing free, it may deform. It is difficult to control the heat to melt the silicon, and keep it molten, while preventing the wall above the melt line from sagging, buckling or otherwise deforming. Maintaining precise control over the heat slows down the CZ process and thus throughput of silicon ingots.

It is known in the art to form a fused crucible with doped silica in the outer layer. The element used to dope the silica is one that promotes crystallization, such as aluminum, when the crucible is heated. Crystallized silica is much stronger than fused glass and will not deform as a result of heat in furnaces of the type used in the CZ and similar processes.

One such known approach dopes the outer layer of a crucible with aluminum in the range of 50-120 ppm. Relatively early in the course of a long CZ process, the outer wall crystallizes as a result of the aluminum doping. The crystallized portion is more rigid than the remainder of the crucible and therefore supports the upper wall above the melt line.

This prior art approach produces at least two kinds of problems, depending on the level of doping. First, the doping level must be high enough to create a rigid outer wall that supports the upper wall above the melt line. If the doping level is too low, the wall is subject to deformation in a manner similar to an undoped crucible. But when the doping level is high enough to support the upper wall, that portion of the wall beneath the melt line is subject to very high heat during the CZ process. This forms a very thick crystalline layer below the melt line. As a result of the prolonged heat and thick crystalline layer, the wall beneath the melt line may crack.

DETAILED DESCRIPTION

Figure 1:
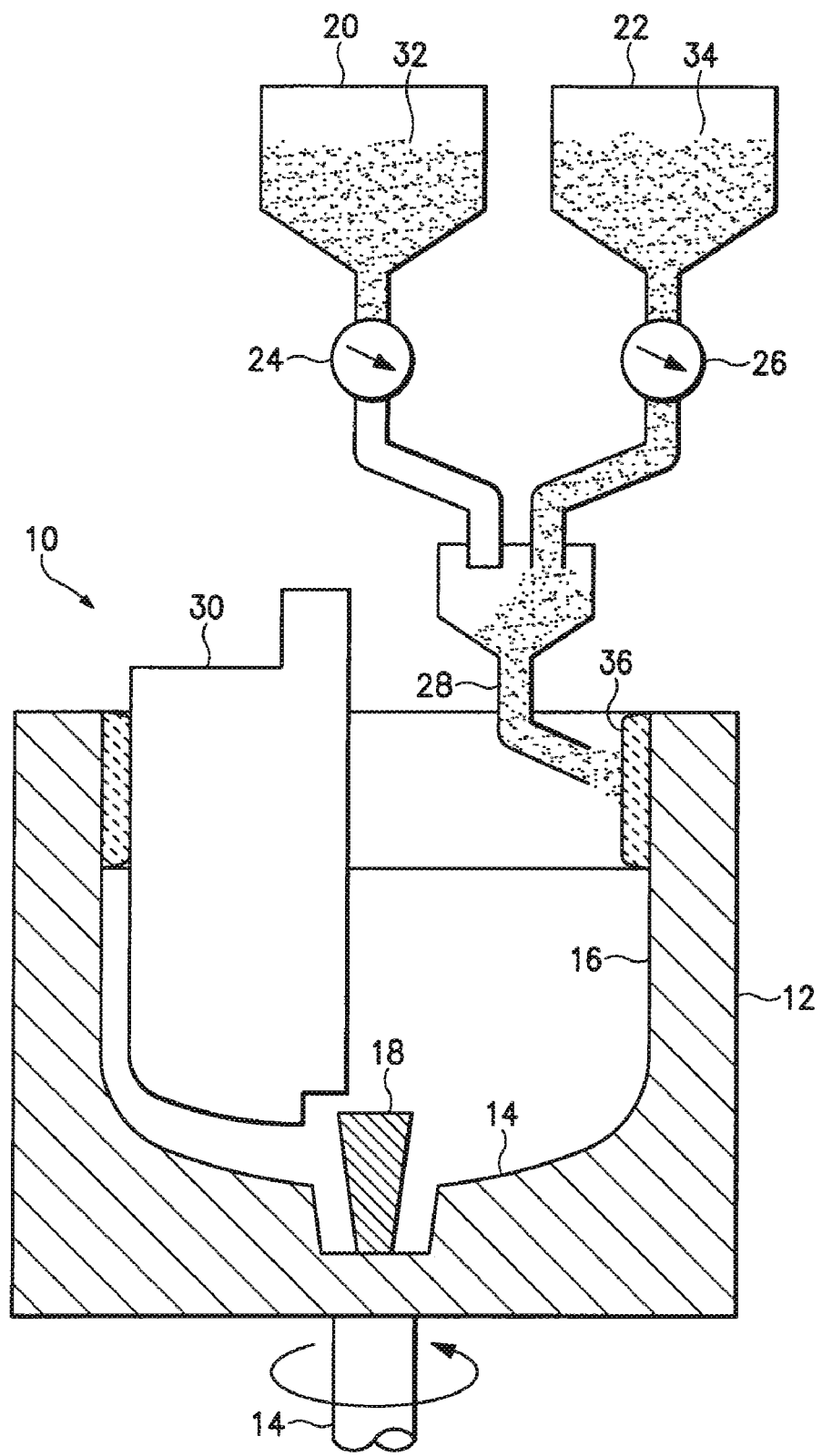
FIGS. 1-3 are cross-sectional, highly schematic, side views of a mold showing sequential stages for forming a crucible of the type having a funnel at the lower end thereof.

Indicated generally at 10 in FIG. 1 is a system for making a fused glass crucible. The system includes a crucible mold 12 that is rotatable on a vertical axel 14. Mold 12 includes a generally horizontal surface 14 on which a bottom portion of a crucible is formed, as well be seen. The mold also includes a generally upright surface 16 against which a wall portion of the crucible is formed. In FIG. 1, system 10 is configured to form a crucible of the type having a nozzle at a lower end thereof. To this end, a graphite plug 18 is positioned in a lower end of the mold to form a passageway that communicates with a nozzle (not shown) that is attached to the crucible after it is fused. For the details of manufacturing a crucible having such a nozzle, reference is made to U.S. patent application Ser. No. 11/271,491 for a Silica Vessel with Nozzle and Method of Making, filed Nov. 9, 2005, which is hereby incorporated herein by reference for all purposes.

System 10 includes a bulk grain hopper 20 and a doped grain hopper 22. The flow of grain from each hopper is controlled by regulating valves 24, 26, respectively. A feed tube 28 introduces flow of silica grain into mold 12 from either one of or both of the hoppers depending upon how valves 24, 26 are set. Feed tube 28 is vertically movable into and out of mold 12. This facilitates selectively depositing grain on upright surface 16 and on generally horizontal surface 14, as well be further explained. A spatula 30 is also vertically movable and in addition is horizontally movable to shape grain in mold 12 as it rotates.

Consideration will now be given to how system 12 is used to make a crucible. First, hopper 20 is loaded with bulk silica grain 32. And hopper 22 is loaded with aluminum-doped silica grain 34. Silica grain 34 may be doped with aluminum in the range of about 85-500 ppm.

Next, mold 12 is rotated at a rate of about 100 rpm, feed tube 28 is positioned as shown in FIG. 1, and valve 26 is opened to begin depositing doped grain 34 in a band or collar 36 about the perimeter of mold 12. The feed tube is moved vertically to deposit doped grain as shown. The rotation rate is high to keep the doped grain in collar 36 above a predetermined level on generally upright surface 16. If the rotation rate is too low, doped grain falls into lower portions of the mold, which is undesirable. In the present embodiment, the radially outer surface of collar 36 comprises the outermost portion of the uppermost part of the crucible wall. The doped grain that forms the collar is deposited in a layer that has a thickness (measured along a radial axis of mold 12) that is defined by the position of spatula 30. This thickness may have a range of about 0.7-2.0 mm in the fully formed crucible. As will be seen, there is an outermost layer of silica grain that is not fused. This prevents burning of the mold and makes it easier to remove the crucible from the mold. The thickness of this unfused grain must be taken into account to provide the 0.7-2.0 mm thickness in the finished product.

Figure 2:
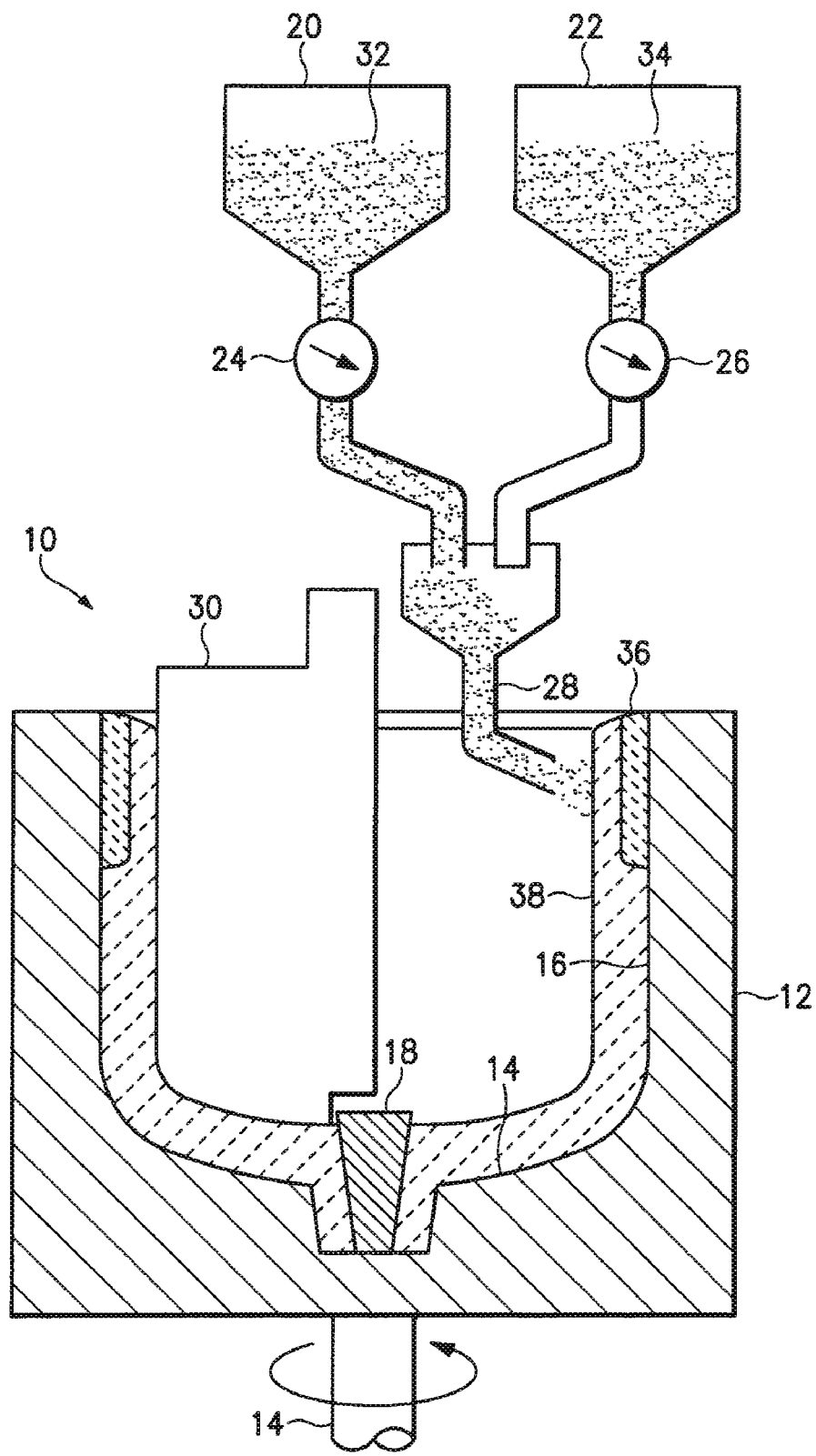

After collar 36 is laid down as described above, valve 26 is closed, and valve 24 as opened, as shown in FIG. 2. In addition, the rate of rotation of mold 12 is reduced to 75 rpm. This permits some of the bulk grain 32 to fall to the lower portion of mold 12. As bulk silica grain feeds from hopper 20 out of feed tube 28, the feed tube moves vertically to coat the side and bottom of the mold with a layer 38 of bulk grain silica as shown. Spatula 30 shapes the bulk grain layer into the form of a crucible. As can be seen, layer 38 covers substantially all of collar 36. Graphite plug 18 defines an opening through layer 38 in the shape of the plug.

Figure 3:
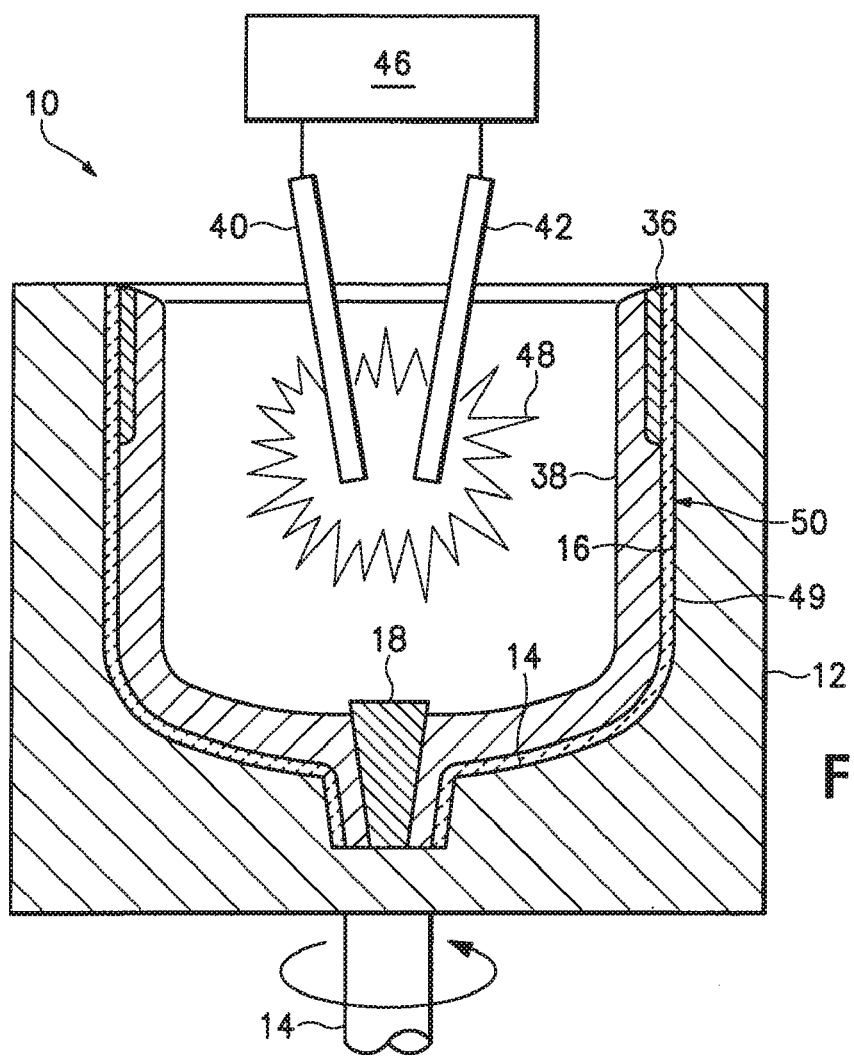
Figure 4:
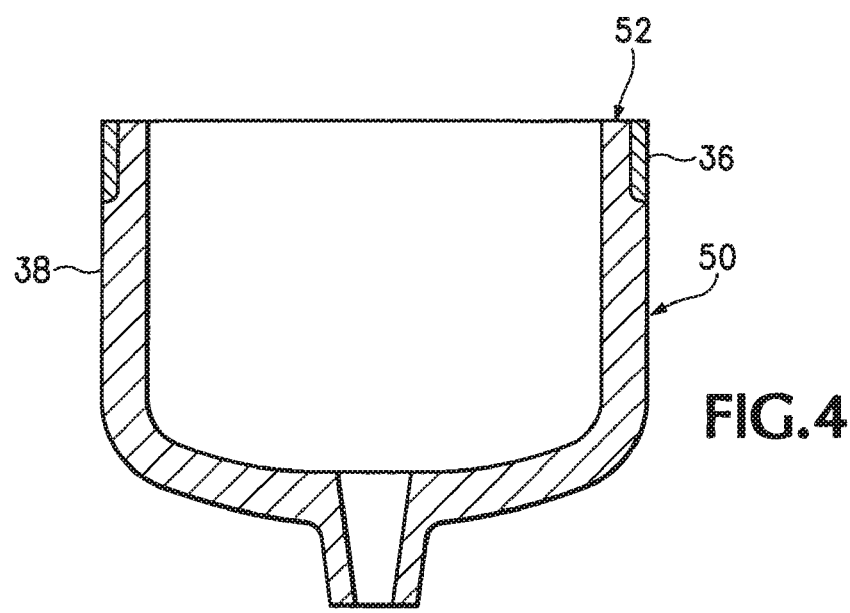
FIG. 4 is a cross-sectional view of a crucible so formed.

With reference to FIG. 3, after the silica grain crucible is defined in mold 12 as shown in FIG. 2, spatula 30 and feed tube 28 are withdrawn. Electrodes 40, 42 are vertically movable into and out of the interior of mold 12. The electrodes are attached to a DC power supply 46 that can apply power to the electrodes in a selectable range between about 300 KVA and 1200 KVA. When sufficient power is supplied to the electrodes, an extremely hot plasma ball forms around the electrodes. The heat so generated creates a fusion front that fuses the silica grain beginning at the inner surface of the formed crucible and proceeding to the outer surface. This fusion front fuses most of layer 38 and the collar 36 of doped silica grain but stops—as a result of stopping the application of power to electrodes 40, 42—before it fuses an outermost unfused layer 49 of grain that includes both bulk silica grain 38 and doped silica grain 36. As previously mentioned, the depth of the grain deposited into mold 12 must take into account this unfused layer 49 so that a depth of the fused doped grain 36, as shown in FIG. 4, is in the range of 0.7-2.0 mm. A unitary fused glass crucible 50 is shown in FIG. 4 after it is removed from mold 12 and graphite plug 18 has been removed.

It can be seen that an upper portion of crucible 50 has been cut off to produce a flat upper rim 52. This provides a crucible of a predetermined height and also provides a flat upper rim. As can be seen, in FIG. 4, collar 36 provides an outermost and uppermost portion of crucible 50. After the upper portion of the cut is made, collar 36—in the present embodiment—extends about 50 mm downwardly from rim 52. It should be appreciated, however, that collar 36 could be formed to extend much further down the crucible—as much as ⅔ or ⅓ of the way down thus providing a much taller collar. As will be described shortly, a shorter caller is preferred.

Figure 5:
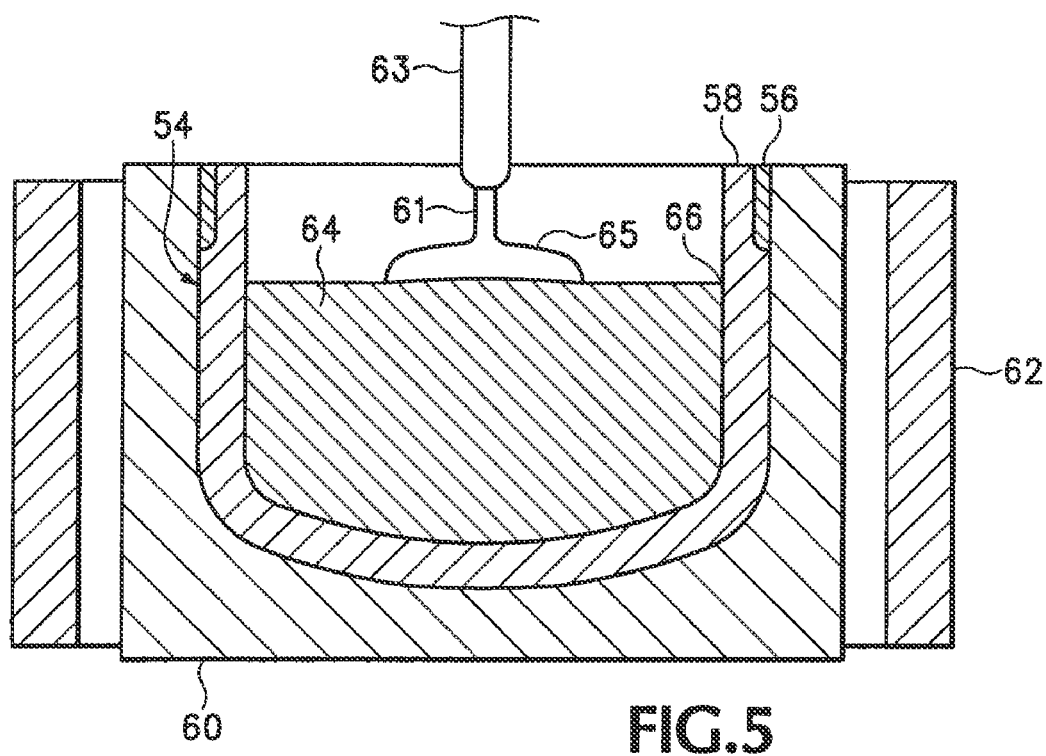
FIG. 5 is a cross-sectional view of an alternative crucible formed according to the present invention in use during a CZ process.

Turning now to FIG. 5, indicated generally at 54 is a crucible in use in a CZ process. Crucible 54 is made in substantially the same manner as crucible 50 except that it does not have an opening in a lower portion thereof. This is accomplished simply by using a mold having a continuous smooth lower surface and omitting use of a graphite plug, like plug 18. Crucible 54 includes an aluminum doped collar 56, which is formed as described above in connection with crucible 50. Like crucible 50, crucible 56 has been cut along a plane at right angles to its longitudinal axis. This produces a substantially flat rim 58.

Crucible 54 is supported in a susceptor 60 that is inside a furnace (not shown). The susceptor is surrounded by a heater 62. Crucible 54 has been charged with metallic silicon that has melted, which is now referred to as the melt 64, in response to heat produced by heater 62 inside the furnace. A single silicon seed crystal 61 is held by a holder 63, which slowly draws seed crystal 61 from the molten silicon in accordance with the CZ process. A crystalline ingot 65 forms, also in accordance with the CZ process, on the lower end of seed crystal 61. Melt line 66 is defined about the perimeter of crucible 54. The melt line progressively lowers as ingot 65 forms and is pulled from melt 64.

The melt 64 is at a temperature of about 1400 degrees C. As a result, the surface of crucible 54 beneath the melt line is also at that temperature. Even though the heat from the melt makes the crucible below melt line 66 very soft, the weight of the melt presses the crucible into susceptor 60 thus preventing any deformation of crucible 54 below melt line 66. As the metallic silicon melts, the heat begins to crystallize crucible 54 in collar 56 as a result of the aluminum doped silicon within the collar. The portion of the crucible that is crystallized is hardened. This creates a relatively rigid crystalline ring or collar around the crucible, which stabilizes the portion of the crucible wall that is not crystallized. In other words, the rigid collar prevents the softer uncrystallized wall above the melt line from collapsing or otherwise deforming even as melt line 66 lowers to the bottom of the crucible.

Finally, crucible 50 is shown in use in FIG. 5. It also is held in a susceptor 68. Likewise a heater 70 surrounds the susceptor 68 with all of the structure shown in FIG. 6 being contained within a furnace (not shown). Silicon melt 72 was formed by melting metallic silicon in crucible 50 by heating it with heater 70 in the furnace. A nozzle 74, which was formed with graphite plug 18, on the lower portion of crucible 50 is plugged during while the silicon is melted. Once fully molten, the plug is removed, and melt 72 pours through nozzle 74—as shown in the drawing—into molds (not shown) that are used to make solar cells.

Figure 6:
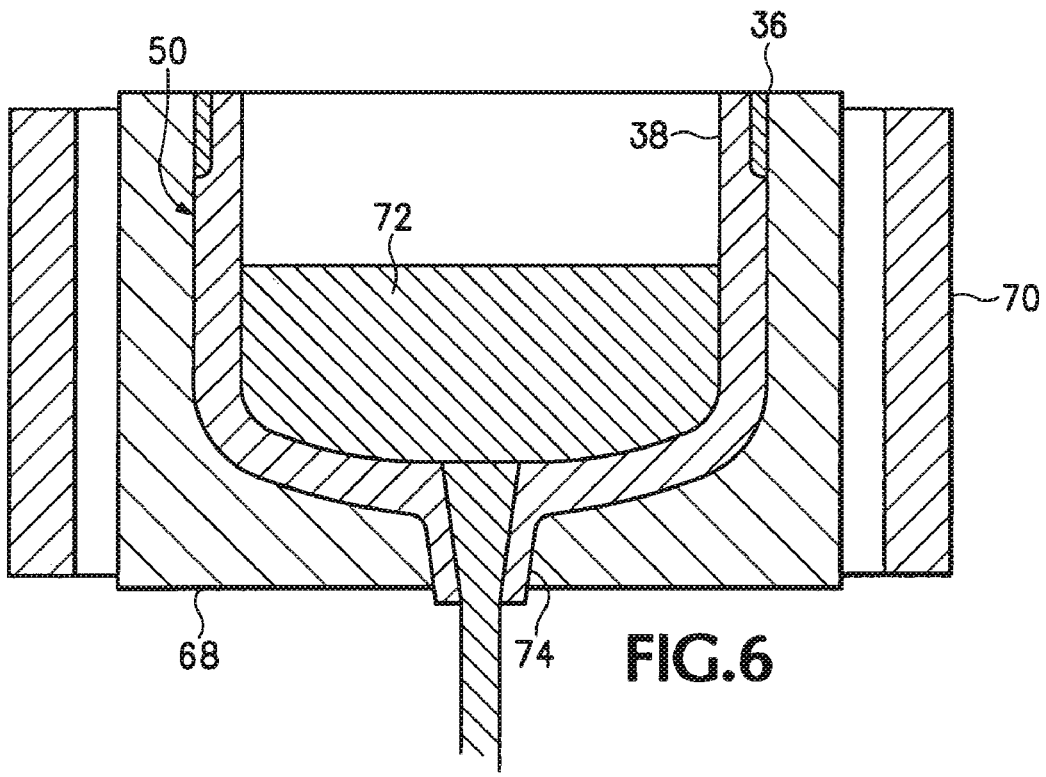
FIG. 6 is a cross-sectional view of the crucible of FIG. 4 in use during a process for making solar cells.

As with the crucible of FIG. 5, the FIG. 6 crucible walls are supported as a result of the crystalline ring formed when collar 36 begins to crystallize early in the CZ process. As a result, the walls of the crucible are supported above the melt line.

It should be appreciated that the aluminum-doped collars, like collars 36, 58, can be formed so that the lower portion thereof is substantially at or slightly above the melt line when the crucibles are used. Or they may be slightly below the melt line—at least at the beginning of the CZ process. A good position for the lower end of the collar is less than about 5% of the crucible height below the melt line.

The following examples demonstrate the advantages of the invention.

Example A

A crucible like crucible 50 was formed that has a height of 400 mm, 270 mm inner diameter, and 10 mm wall thickness. In this example the crucible was doped with 100 ppm aluminum to form a collar, like collar 36 that extends 150 mm down from rim 52. The collar is 1.4 mm thick and defines an outermost and uppermost surface of the crucible as shown in the drawing. A charge of 120 kg metallic silicon was charged and kept in the crucible for 120 hours without problems.

Example B

A crucible like crucible 50 was formed that has a height of 400 mm, 270 mm inner diameter, and 10 mm wall thickness. In Example B the crucible was doped with 500 ppm aluminum to form a collar, like collar 36 that extends 50 mm down from rim 52. The collar is 1.6 mm thick and defines an outermost and uppermost surface of the crucible as shown in the drawing. A charge of 120 kg metallic silicon was charged and kept in the crucible for 120 hours without problems.

Example C

A crucible like crucible 50 was formed that has a height of 400 mm, 270 mm inner diameter, and 10 mm wall thickness. In this example the crucible was doped with 100 ppm aluminum to form a collar, like collar 36 that extends 310 mm down from rim 52, which is substantially all of the generally upright outer wall of the crucible. The collar defines an outermost and uppermost surface of the crucible as shown in the drawing. A charge of 120 kg metallic silicon was charged and in the crucible. In this example, the melt overlaps substantially with the collar. Put differently, the melt line was substantially above the lower edge of the collar. After 50 hours of holding the melt, the crucible showed cracking between the substantially upright wall portion and the substantially horizontal bottom portion. This cracking results from the melt being in close proximity to the doped, and therefore crystallized, collar.

Although the examples each use aluminum as a dopant, it should be appreciated that the invention could be implemented with any dopant that promotes crystallization, e.g., Barium.

As can be seen, when the doped portion and the melt do not overlap, or overlap only slightly, the problems associated with the prior art fully doped outer crucible wall can be avoided. In addition, when the process use is known, i.e., how much silicon will be charged in the crucible and how quickly the melt will be drawn down, a crucible can be designed in which there is overlap between the collar and the melt, but only for a few hours, not enough to damage the crucible, during the early stages of the process. As a result, the problems associated with the prior art can be avoided even where there is overlap of the melt and the doped collar in the early stages of the process.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and sub-combinations of the various elements, features, functions and/or properties disclosed herein.

The invention claimed is:

1. A fused glass crucible comprising:
   a generally upright substantially cylindrical crucible wall formed from fused bulk silica grain;
   a generally horizontal crucible bottom formed from fused bulk silica grain, the bottom being joined with the lower end of the crucible wall;
   a substantially cylindrical collar formed from fused doped silica grain contained in the wall, the collar being located at an upper portion of the wall; and
   a lower portion of the wall extending substantially between the bottom and the collar that is free from doped silica grain.

2. The fused glass crucible of claim 1 wherein the collar is contained within the outermost portion of the wall.

3. The fused glass crucible of claim 2 wherein the collar is contained within the uppermost portion of the wall.

4. The fused glass crucible of claim 3 wherein the collar has a height of about 50 mm.

5. The fused glass crucible of claim 1 wherein the collar extends from the rim of the crucible about ⅔ of the way down the wall.

6. The fused glass crucible of claim 1 wherein the collar extends from the rim of the crucible about ⅓ of the way down the wall.

7. The fused glass crucible of claim 1 wherein the doped silica grain comprises aluminum doped silica grain.

8. The fused glass crucible of claim 7 wherein the doped silica grain is doped with aluminum in the range of about 85 ppm to 500 ppm.

9. The fused glass crucible of claim 1 wherein the collar has a radial depth of about 0.7 to about 2.0 mm.

10. The fused glass crucible of claim 9 wherein the collar has a height of about 50 mm.

\* \* \* \* \*